US009595898B1

(12) United States Patent
Inoue et al.

(10) Patent No.: US 9,595,898 B1
(45) Date of Patent: Mar. 14, 2017

(54) DEVICE FOR CONTROLLING MOTOR DRIVING (71) Applicant: Kabushiki Kaisha Toshiba, Minato-ku, Tokyo (JP)

(72) Inventors: Kouji Inoue, Fujisawa Kanagawa (JP); Tooru Asakawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/054,784

(22) Filed: Feb. 26, 2016

(30) Foreign Application Priority Data

Aug. 18, 2015 (JP) .................................. 2015-161429

(51) Int. Cl.
| H02P 6/00 | (2016.01) |
| H02P 6/18 | (2016.01) |
| H03K 3/037 | (2006.01) |
| H03K 5/1536 | (2006.01) |
| H03K 5/24 | (2006.01) |
| H03K 17/687 | (2006.01) |

(52) U.S. Cl.
CPC .............. *H02P 6/18* (2013.01); *H03K 3/037* (2013.01); *H03K 5/1536* (2013.01); *H03K 5/24* (2013.01); *H03K 17/6874* (2013.01)

(58) Field of Classification Search
CPC ........ H02P 6/182; H02P 25/028; H02P 9/302; H03K 2217/0027; H03K 5/1536
USPC ............ 318/400.32, 400.04, 400.06, 400.29, 318/400.34, 400.35
See application file for complete search history.

(56) References Cited

U.S. PATENT DOCUMENTS

| 5,886,484 A * | 3/1999 | Fucili ........................ H02P 7/04 |
| | | 318/400.25 |
| 6,066,930 A * | 5/2000 | Horiguchi ................ H02P 7/04 |
| | | 318/400.29 |
| 7,847,507 B2 * | 12/2010 | Wagoner .................. H02M 7/48 |
| | | 318/599 |
| 8,896,257 B2 * | 11/2014 | Takada ...................... H02P 8/38 |
| | | 318/685 |

(Continued)

FOREIGN PATENT DOCUMENTS

| JP | 2007-274760 | 10/2007 |
| JP | 2010-178477 | 8/2010 |

(Continued)

Primary Examiner — Bentsu Ro
Assistant Examiner — Thai Dinh
(74) Attorney, Agent, or Firm — White & Case LLP (57) ABSTRACT

According to one embodiment, a device for controlling motor driving which includes a first comparator, a second comparator, a zero level detecting portion, and a data determining portion is provided. The first comparator compares a voltage induced in a coil with a first threshold value. The second comparator compares the induced voltage with a second threshold value which is different from the first threshold value. The zero level detecting portion detects that a current flowing in an H-bridge circuit is zero. The data determining portion determines a value of digital data to be inputted to a DA convertor which generates a reference voltage for use in controlling a driving current of the motor based on an output of the first comparator, an output of the second comparator and an output of the zero level detecting portion.

12 Claims, 11 Drawing Sheets

(56) References Cited

U.S. PATENT DOCUMENTS

2016/0118916 A1* 4/2016 Gohara .................. H02P 6/008
                                                    318/400.13

FOREIGN PATENT DOCUMENTS

| JP | 2011-259525 | 12/2011 |
| JP | 2013-255386 | 12/2013 |

* cited by examiner

| C1 | C2 | JUDGING RESULT |
|---|---|---|
| 1 | 1 | SUBTRACTION |
| 0 | 0 | BOOST PROCESSING |
| 1 | 0 | DATA RETAINING |

|     | C1 | C2 | X1 | X2 | JUDGING RESULT |
|-----|----|----|----|----|----------------|
| (a) | 1  | 1  | 0  | 0  | SUBTRACTION |
| (b) | 1  | 1  | 0  | 1  | DATA RETAINING |
| (c) | 1  | 1  | 1  | 1  | ADDING |
| (d) | 1  | 0  | 0  | 0  | ADDING |
| (e) | 1  | 0  | 1  | 0  | BOOST PROCESSING |
| (f) | 0  | 0  | 0  | 0  | BOOST PROCESSING |

DEVICE FOR CONTROLLING MOTOR DRIVING

CROSS-REFERENCE TO RELATED APPLICATION

This application is based upon and claims the benefit of priority from the prior Japanese Patent Application No. 2015-161429 filed on Aug. 18, 2015, the entire contents of which are incorporated herein by reference.

FIELD

Embodiments described herein relate generally to a device for controlling motor driving.

BACKGROUND

In driving control of a stepping motor, the driving efficiency is highest when a zero-cross phase of a driving current of the motor matches with a zero-cross phase of a voltage induced by rotation of a rotor. However when the driving efficiency is increased too high, step-out may occur in a low load condition because of fluctuations of the rotation of the motor. Accordingly in high efficiency driving, it is necessary to supply more current than a required minimum current in order to stabilize rotation of a motor.

Thus, an amount of driving current of a motor is conventionally controlled based on a result of comparing a voltage induced in a coil of a motor during a time period when both ends of the coil of the motor are in a high impedance state and an offset voltage, by using a comparator.

In this case, when the voltage induced in the coil of the motor is larger than the offset voltage, the driving current of the motor is controlled to be reduced. Since an initial value of the driving current of the motor is set to a maximum current, the driving current is gradually decreased in a low load condition according to the control mentioned above. On the other hand, when the load varies to become large, the induced voltage of the coil of the motor becomes smaller than the offset voltage. In this case, boost processing is carried out to increase the driving current rapidly.

However, when fluctuations of rotation of the rotor occur, the voltage induced in the coil of the motor becomes smaller than the offset voltage even though the load is low. As a result, it causes a problem that unnecessary boost processing is carried out.

DETAILED DESCRIPTION

According to one embodiment, a device for controlling motor driving which can be used in a system to control a current flowing in a coil of a motor by using an H-bridge circuit connected to the coil is provided. The device includes a first comparator, a second comparator, a zero level detecting portion, and a data determining portion. An H-bridge is also called as "Full-bridge."

The first comparator compares a voltage induced in the coil with a first threshold value. The second comparator compares the induced voltage with a second threshold value which is different from the first threshold value.

The zero level detecting portion detects that the current flowing in the H-bridge circuit is zero. The data determining portion determines a value of digital data to be inputted to a DA convertor to generate a reference voltage for use in controlling a driving current of the motor based on an output of the first comparator, an output of the second comparator, and an output of the zero level detecting portion.

Hereinafter, further embodiments will be described with reference to the drawings. In the drawings, the same reference numerals denote the same or similar portions respectively.

Figure 1:
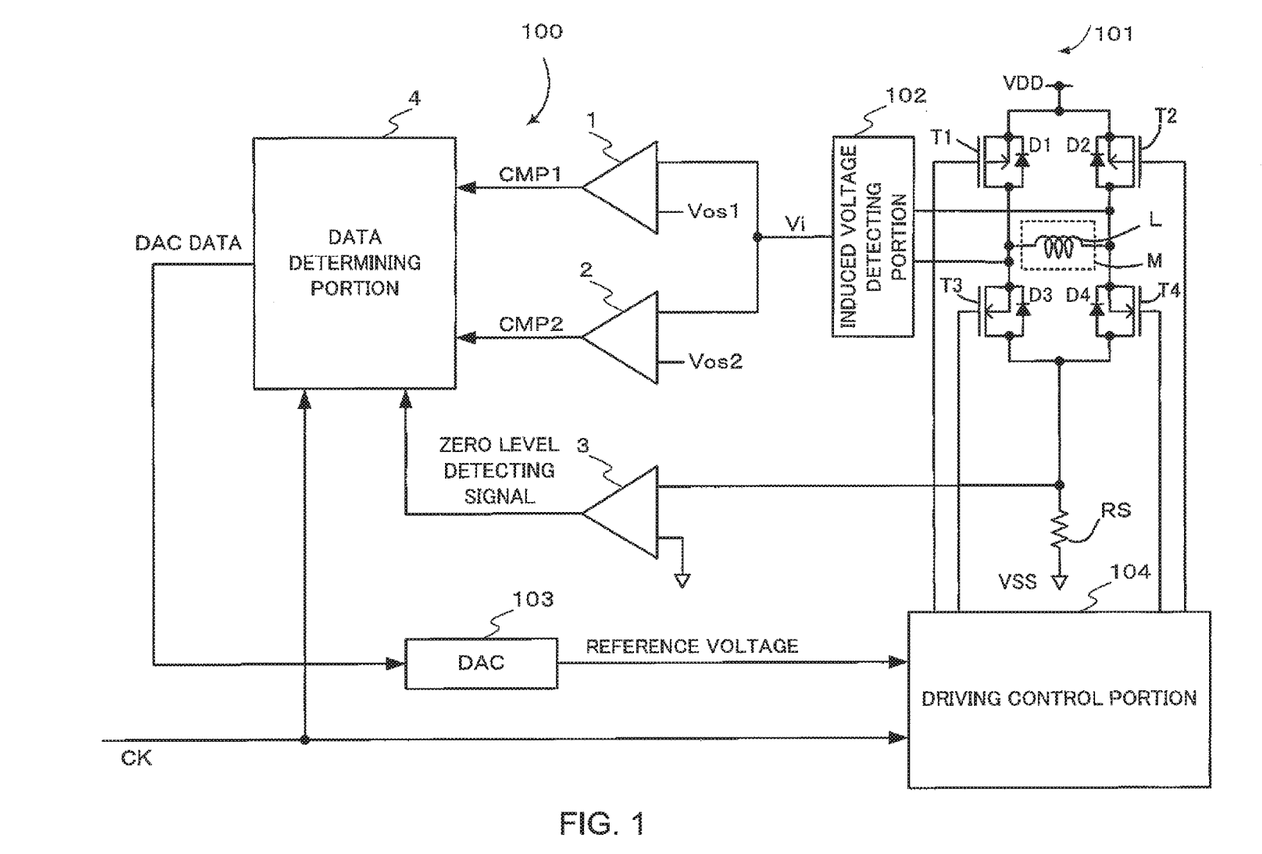
FIG. 1 is a block diagram showing a configuration of a system for controlling a current flowing in a coil of a motor which includes a device for controlling motor driving according to a first embodiment.

FIG. 1 is a block diagram showing a configuration of a system for controlling a current flowing in a coil of a motor. The system includes a device for controlling motor driving according to a first embodiment.

The device 100 of the first embodiment includes a comparator 1, a comparator 2, a zero level detecting portion 3, and a data determining portion 4. The comparators 1 and 2 and the zero level detecting portion 3 can be configured with differential amplifiers.

The comparator 1 compares a voltage Vi, which is induced in a coil L of a motor M during a time period when an H-bridge circuit 101 connected to the coil L is in a high impedance state, with an offset voltage Vos1 as a first threshold value.

In this case, when the induced voltage Vi is lower than the offset voltage Vos1, an output signal CMP1 of the comparator 1 is '1'.

The H-bridge circuit 101 is configured with P channel MOS transistors T1 and T2 and N channel MOS transistors T3 and T4, and controls a direction and conduction of a current flowing to the coil L of the motor M. A source of the MOS transistor T1 and a drain of the MOS transistor T3 are connected with each other, and a source of the MOS transistor T2 and a drain of the MOS transistor T4 are connected with each other. Each drain of the MOS transistors T1 and T2 is connected to a power supply terminal VDD, and each source of the MOS transistors T3 and T4 is connected to a ground terminal VSS. Each of diodes D1 to D4 is connected between a source and a drain of each of the MOS transistors T1 to T4.

The voltage Vi induced in the coil L of the motor M is outputted from an induced voltage detecting portion 102 which is connected to both ends of the coil L.

The comparator 2 compares the voltage Vi induced in the coil L with an offset voltage Vos2 as a second threshold value. The value of the offset voltage Vos2 is set to be different from that of the offset voltage Vos1. Here, when the induced voltage Vi is lower than the offset voltage Vos2, an output signal CMP2 of the comparator 2 is '1'.

Both of the comparator 1 and the comparator 2 compare the voltage Vi induced in the coil L with the respective threshold values. However, the threshold values are different from each other so that judging timings of the induced voltage Vi are different from each other. The offset voltage Vos1 is 100 mV for example, and The offset voltage Vos2 is 400 mV for example.

For example, when Vos1>Vos2 is set, in a falling state of the induced voltage Vi, firstly the output signal CMP 1 of the comparator 1 changes from '0' to '1' and then the output signal CMP 2 of the comparator 2 changes from '0' to '1'. On the other hand, in a rising state of the induced voltage Vi, firstly the output signal CMP 2 of the comparator 2 changes from '1' to '0' and then the output signal CMP 1 of the comparator 1 changes from '1' to '0'.

In the embodiment, polarity of the induced voltage Vi is reversed at each half cycle of the induced voltage Vi according to an output of the induced voltage detecting portion 102 so that an order of changes of the outputs of the comparators 1 and 2 is always constant.

Vos1>Vos2 is set so that the output of the comparator 1 changes first in the falling state of the induced voltage Vi.

The zero level detecting portion 3 is a circuit which detects that the current flowing in the H-bridge circuit 101 is zero. The zero level detecting portion 3 compares a terminal voltage of a resistor RS connected between the H-bridge circuit 101 and the ground terminal VSS with ground potential, and sets a zero level detecting signal to '1', when the terminal voltage of the resistor RS becomes equal to the ground potential.

Since the current flowing in the H-bridge circuit 101 is zero when the H-bridge circuit 101 becomes a high impedance state, the zero level detecting signal outputted from the zero level detecting portion 3 is a signal which indicates that the H-bridge circuit 101 becomes a high impedance state.

In the embodiment, the H-bridge circuit 101 becomes a high impedance state after the current flowing in the coil L is returned to the power supply during a current regeneration period in order to increase detecting sensitivity of the zero level detecting portion 3.

The data determining portion 4 determines a value of digital data to be inputted to a DA convertor 103 which generates a reference voltage for use in controlling a driving current of the motor M, based on the output signal CMP1 of the comparator 1, the output signal CMP2 of the comparator 2 and the zero level detecting signal which is an output signal of the zero level detecting portion 3.

The DA convertor 103 generates the reference voltage to be inputted to a driving controlling portion 104 to control switching of the MOS transistors T1 to T4 of the H-bridge circuit 101.

The driving controlling portion 104 controls the MOS transistors T1 to T4 of the H-bridge circuit 101 such that the driving current of the motor M changes in accordance with change of the reference voltage inputted from the DA convertor 103. The driving control portion 104 controls the H-bridge circuit 101 so that the driving current of the motor M is reduce when the inputted reference voltage is lowered, so that the driving current is increased when the reference voltage becomes high, and so that the amount of the driving current is retained when the reference voltage does not change.

Figure 2:
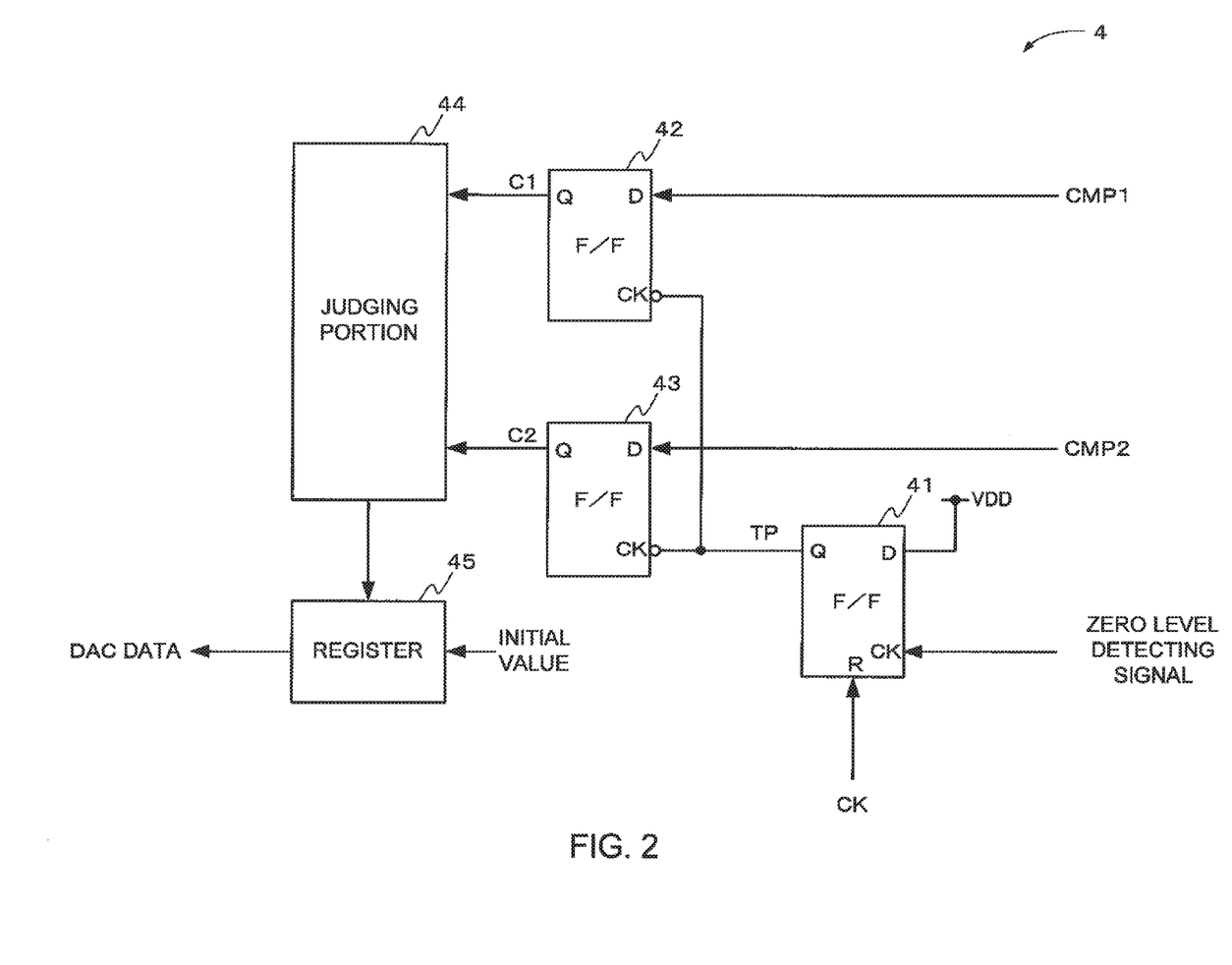
FIG. 2 is a block diagram showing an inner structure of a data determining portion according to the first embodiment.

FIG. 2 shows an example of an inner structure of the data determining portion 4. The data determining portion 4 shown in FIG. 2 includes flip-flop circuits 41 to 43, a judging portion 44 and a register 45.

A data input terminal D of the flip-flop circuit 41 is connected to the power supply terminal VDD, a clock terminal CK of the flip-flop circuit 41 receives the zero level detecting signal, and a reset terminal R of the flip-flop circuit 41 receives a clock signal CK. An output signal TP of the flip-flop circuit 41 is '1' when the zero level detecting signal is '1', and then is reset to '0' when the clock signal CK becomes '1'.

The zero level detecting signal is a signal which becomes '1' when the H-bridge circuit 101 of FIG. 1 becomes a high impedance state. Accordingly, the output signal TP of the flip-flop circuit 41 is a signal which indicates that the H-bridge circuit 101 is in a high impedance period.

A data input terminal D of the flip-flop circuit 42 receives the output signal CMP1 of the comparator 1 in FIG. 1, and a clock terminal CK of the flip-flop circuit 42 receives the output signal TP of the flip-flop circuit 41. The flip-flop circuit 42 is a flip-flop circuit that is synchronized with each falling of a clock signal.

The flip-flop circuit 42 receives a value of the output signal CMP1 of the comparator 1 in synchronization with each falling of the output signal TP of the flip-flop circuit 41 which is an end of each high impedance period of the H-bridge circuit 101.

A data input terminal D of the flip-flop circuit 43 receives the output signal CMP2 of the comparator 2 of FIG. 1, and a clock terminal CK of the flip-flop circuit 43 receives the output signal TP of the flip-flop circuit 41. This flip-flop circuit 43 is also a flip-flop circuit that is synchronized with a falling of a clock signal.

Accordingly, the flip-flop circuit 43 receives a value of the output signal CMP2 of the comparator 2 in synchronization with the end of the high impedance period of the H-bridge circuit 101.

The judging portion 44 determines a value of digital data to be inputted to the DA convertor 103 of FIG. 1 based on a combination of an output signal C1 of the flip-flop circuit 42 and an output signal C2 of the flip-flop signal 43.

The register 45 stores a value determined by the judging portion 44. In an initial state, an initial value is stored in the register 45. The value stored in the register 45 is outputted to the DA convertor 103 as a DAC data.

Figure 3:
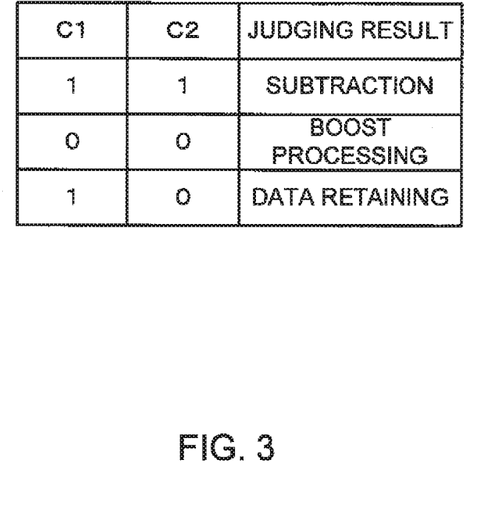
FIG. 3 is a table showing an example of judgment in a judging portion of the data determining portion according to the first embodiment.

FIG. 3 is an example showing judgment results relating to control of a driving current of the motor to be obtained in the judging portion 44. The judgment results correspond to combinations of the output signal C1 of the flip-flop circuit 42 and the output signal C2 of the flip-flop circuit 43. Judging operations of the judging portion 44 will be explained with reference to wave form charts shown in FIG. 4 to FIG. 7.

(1) In a Case of C1=1 and C2=1

Figure 4:
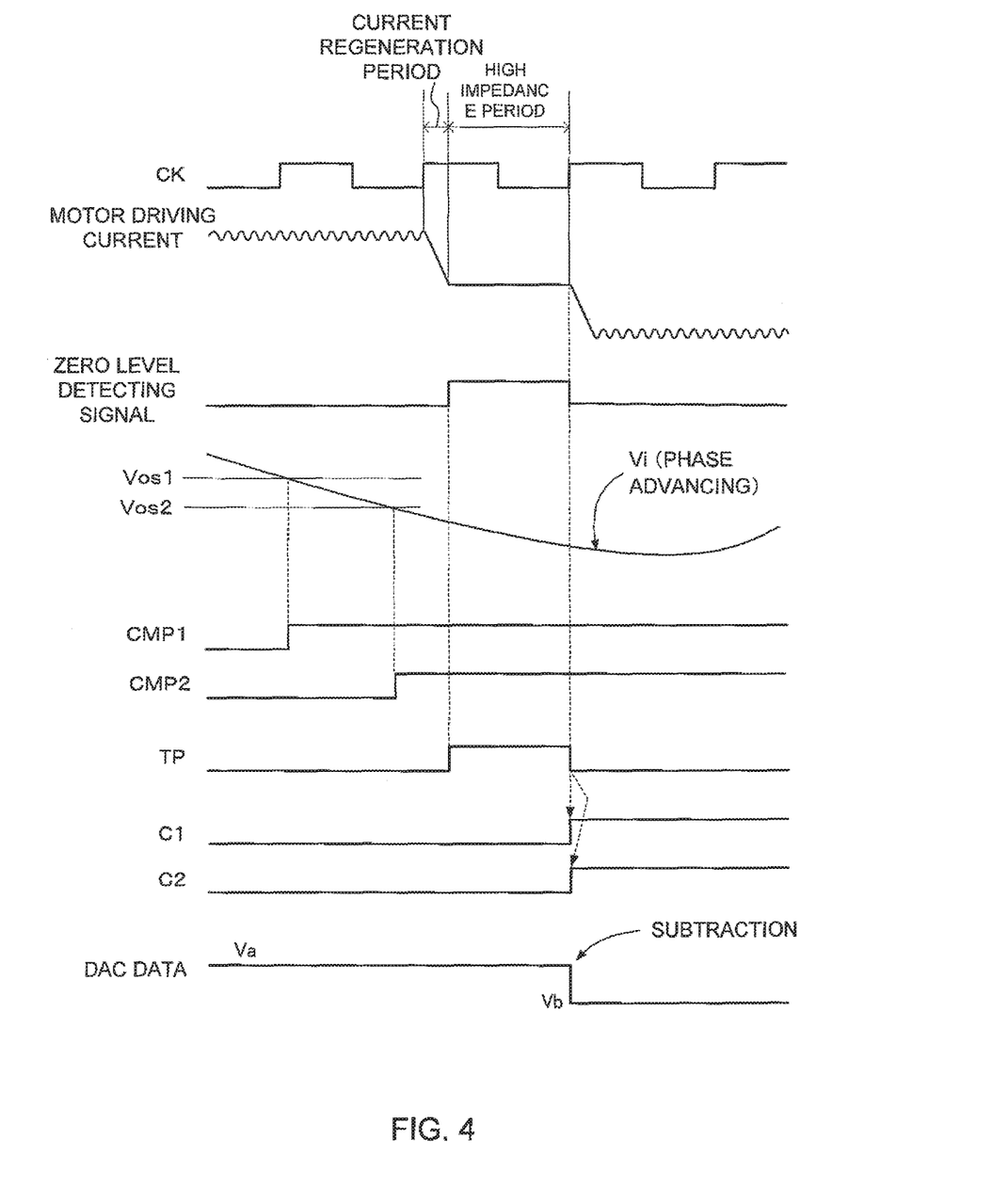
FIG. 4 is a wave form chart showing an example of an operation of the device for controlling motor driving according to the first embodiment.

This combination occurs when the phase of an induced voltage Vi is more advanced than the phase of a driving current of the motor as shown in FIG. 4.

When the phase of the induced voltage Vi is more advanced than the phase of the driving current of the motor, both of the output signal CMP1 of the comparator 1 and the output signal CMP2 of the comparator 2 become '1' before the zero level detecting signal becomes '1'. Accordingly both of the output signals C1 and C2 which are outputted from the flip-flop circuit 42 and flip-flop circuit 43 respectively are '1' at the time of a falling of the output signal TP of the flip-flop circuit 41.

In this case, since the load of the motor M is considered as a light load, the judging portion 44 determines the DAC data to be a value Vb which is obtained by subtracting or reducing a certain value from a present value Va in order to decrease the driving current of the motor M. The certain value is predetermined, and is "1", for example, in the case that the DA converter 103 is constituted of 8 bits.

As a result of the determination mentioned above, the DAC data becomes the value Vb obtained by subtracting the certain value from the present value Va at the time of a falling of the output signal TP of the flip-flop circuit 41 which is an end of the high impedance period of the H-bridge circuit 101, as shown in FIG. 4.

(2) In a Case of C1=0 and C2=0

Figure 5:
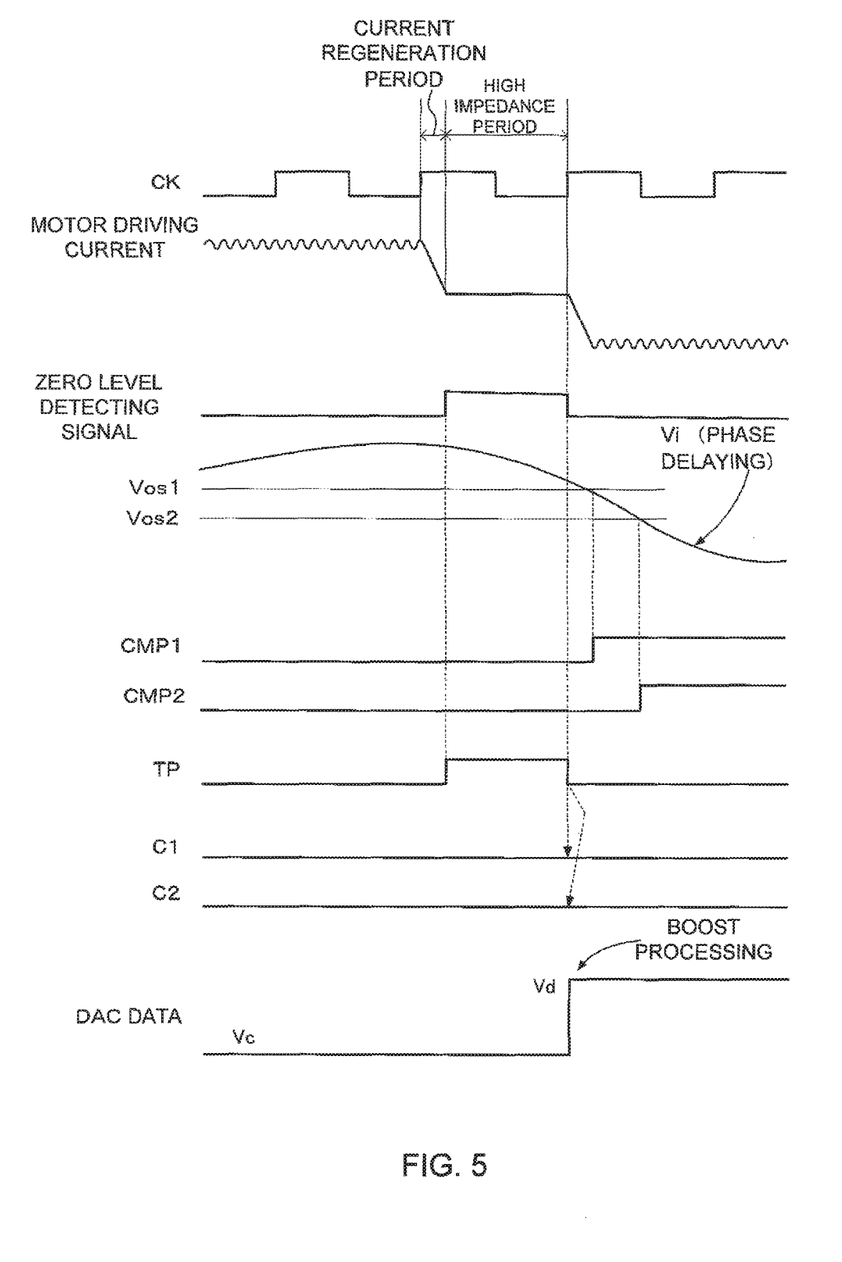
FIG. 5 is a wave form chart showing another example of the operation of the device for controlling motor driving according to the first embodiment.

Such a combination occurs when the phase of an induced voltage Vi is delayed more than the phase of a driving current of the motor as shown in FIG. 5.

When the phase of the induced voltage Vi is delayed more than the phase of the driving current of the motor, the output signal CMP1 of the comparator 1 and the output signal CMP2 of the comparator 2 are '1' at an end of a high impedance period of the H-bridge circuit 101. Accordingly both of the output signals C1 and C2 outputted from the flip-flop circuit 42 and flip-flop circuit 43, respectively are '0' at the time of a falling of the output signal TP of the flip-flop circuit 41.

In this case, since the load of the motor M is considered as a heavy load, boost processing for the driving current of the motor is required to be performed in order to rapidly increase torque of the motor M. Accordingly the judging portion 44 determines the DAC data to be a value Vd for boost processing.

As a result of such a determination, the DAC data increases to the boost processing value Vd from a present value Vc drastically at an end of a high impedance period of the H-bridge circuit 101, as shown in FIG. 5.

(3) In a Case of C1=1 and C2=0

Figure 6:
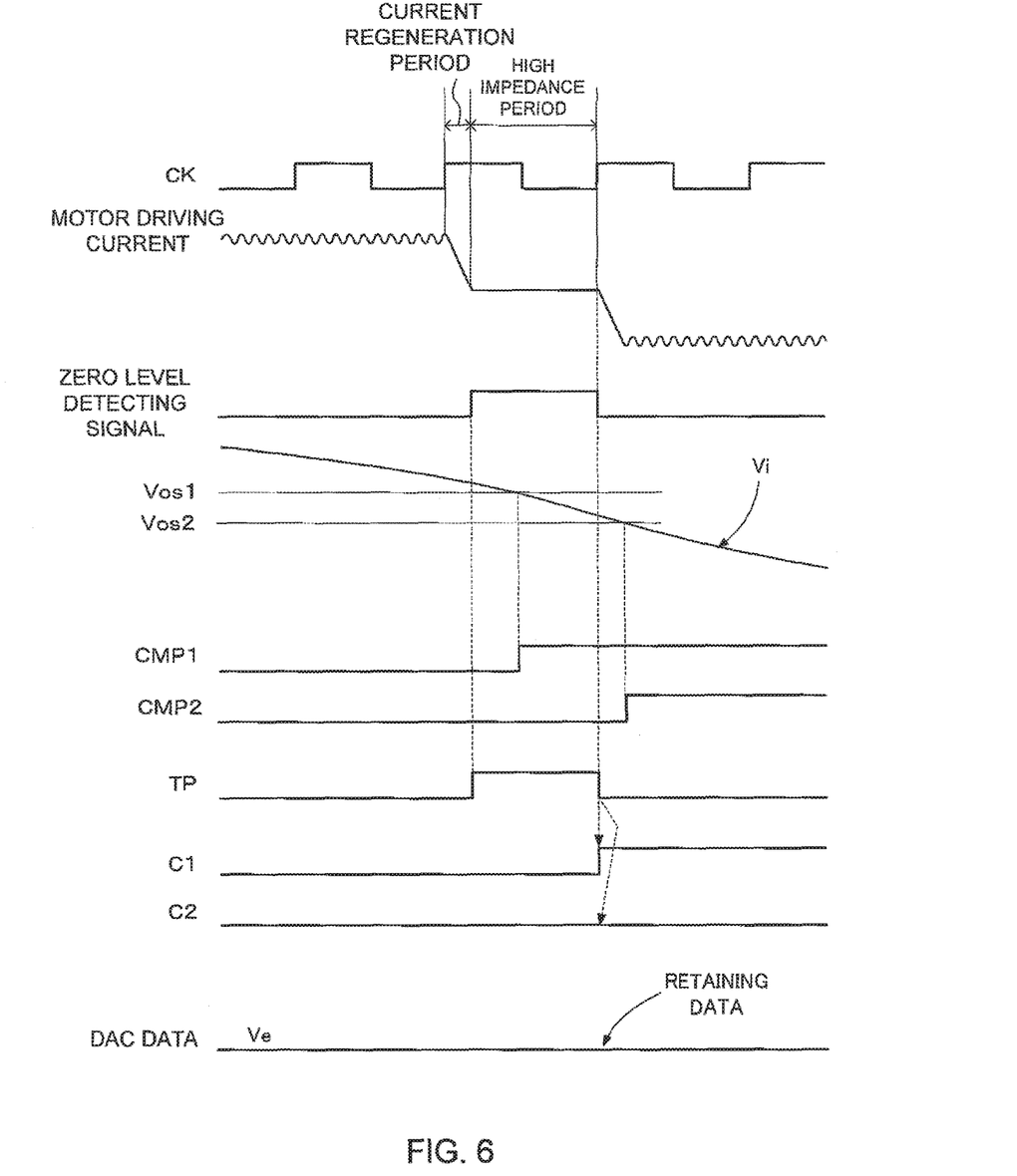
FIG. 6 is a wave form chart showing yet another example of the operation of the device for controlling motor driving according to the first embodiment.

Such a combination occurs when a phase of an induced voltage Vi is substantially matches with a phase of a driving current of the motor as shown in FIG. 6.

When the phase of the induced voltage Vi is substantially matches with the phase of the driving current of the motor, the output signal CMP1 of the comparator 1 becomes '1' before an end of a high impedance period of the H-bridge circuit 101, however, the output signal CMP2 of the comparator 2 becomes '1' after the end of the high impedance period of the H-bridge circuit 101. Accordingly, the output signals C1 of the flip-flop circuit 42 is '1' but the output signal C2 of the flip-flop circuit 43 maintains '0' at the time of a falling of the output signal TP of the flip-flop circuit 41.

In this case, since the driving current is considered to be optimal, the judging portion 44 determines to retain a present value Ve as a value of the DAC data.

(Operation at Occurrence of Fluctuations of Rotor Rotation)

Figure 7:
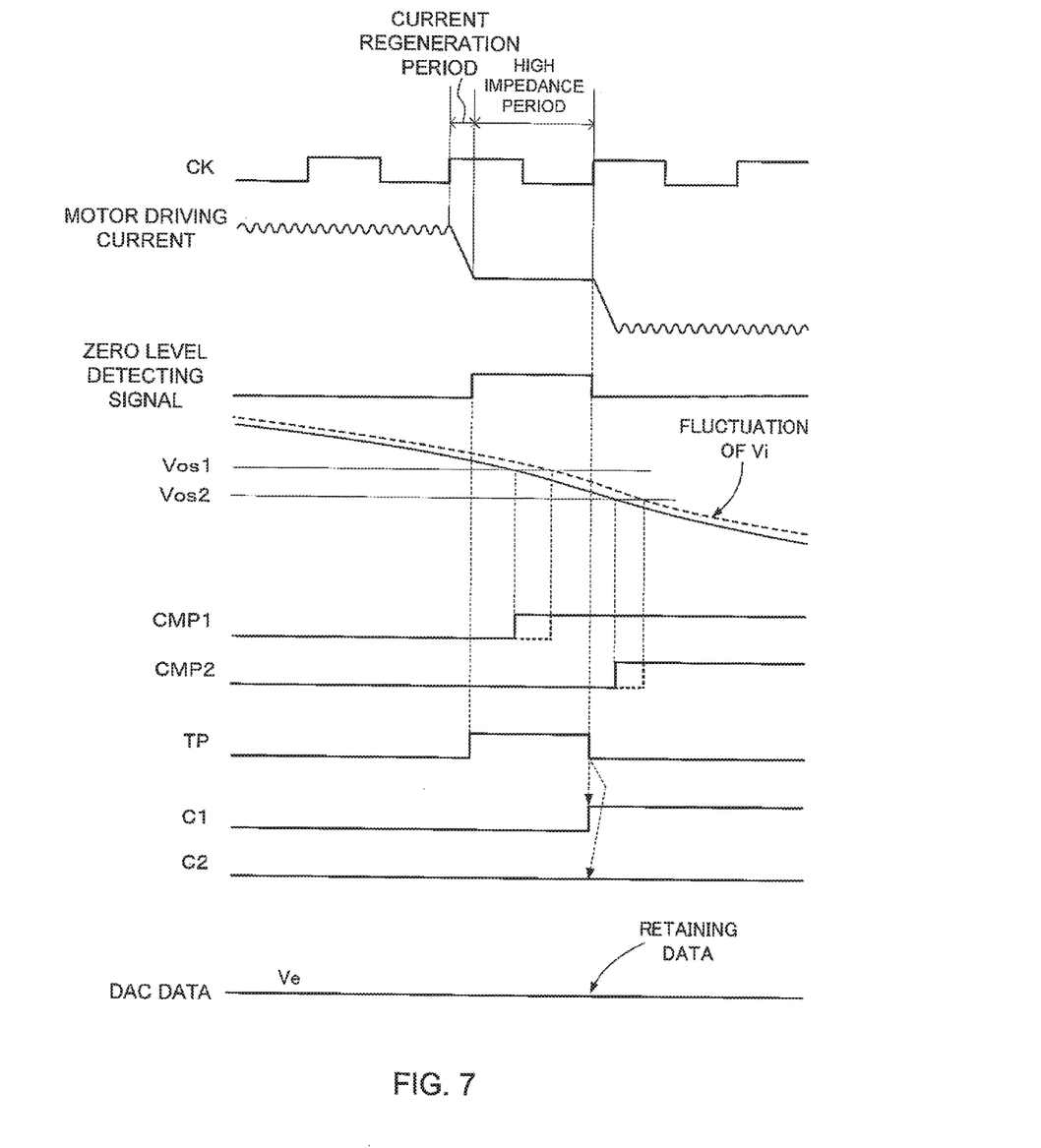
FIG. 7 is a wave form chart showing a further example of the operation of the device for controlling motor driving according to the first embodiment.

When fluctuations of rotor rotation occur under the condition of (3) mentioned above, the induced voltage Vi also fluctuates and the phase of the induced voltage may be delayed as shown in FIG. 7. In this case, risings of the output signal CMP1 of the comparator 1 and the output signal CMP2 of the comparator 2 are also delayed.

However, when the output signal CMP1 of the comparator 1 rises before the end of the high impedance period of the H-bridge circuit 101, the output signal C1 of the flip-flop circuit 42 maintains '1'. Accordingly, in this case, the judging portion 44 determines to retain the value Ve of the DAC data.

Even if fluctuations of the rotor rotation occur, boost processing is not performed as long as the output signal C1 of the flip-flop circuit 42 is '1'.

(Processing in a Case where a Zero Level Detecting Signal is not Outputted)

When a frequency of the clock signal CK is high, the high impedance period of the H-bridge circuit 101 is short so that a processing in the zero level detecting portion 3 may not be finished in time and the zero level detecting signal may not be outputted. In this case, the data determining portion 4 retains a present value of the DAC data or set a value of the DAC data to the initial value.

According to the embodiment, it is possible to prevent boost processing from being performed when fluctuations of rotor rotation occur at a time of high efficiency driving and the phase of an induced voltage of the coil L of the motor M is delayed, since two comparators are provided and a value of the DAC data is determined based on a combination of output values of these two comparators at an end of a high impedance period of the H-bridge circuit 101. Accordingly, it is possible to prevent unnecessary boost processing due to the fluctuations of the rotor rotation from being performed.

In the embodiment, the driving current of the motor M is controlled by the data determining portion 4 which can carry out judgements relating to boost processing based on a combination of output values of two comparators 1 and 2. A second embodiment described below shows an example using a data determining portion that can carry out judgements not only for boost processing, but also for step-out prevention.

Figure 8:
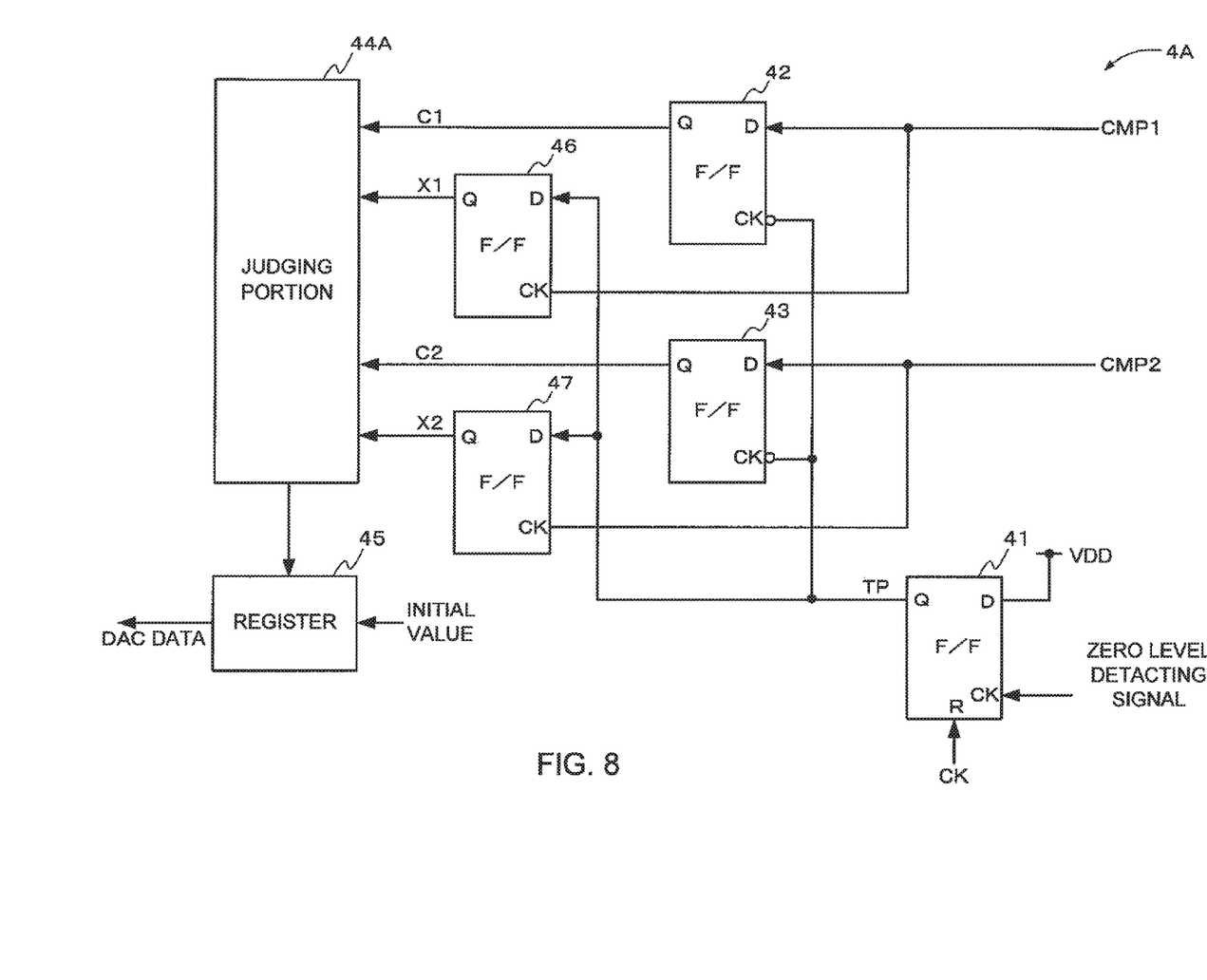
FIG. 8 is a block diagram showing an inner structure of a data determining portion according to a second embodiment.

FIG. 8 is a block diagram showing an inner structure of a data determining portion 4A provided in a device for controlling motor driving according to the second embodiment. The configuration of the second embodiment is similar to that of the first embodiment except for a configuration of the data determining portion 4A. In the data determining portion 4A, flip-flop circuits 46 and 47 are added to the data determining portion 4 of the first embodiment shown in FIG. 2, and outputs of those flip-flop circuits 46 and 47 are inputted to a judging portion 44A.

The flip-flop circuit 46 and the flip-flop circuit 47 are circuits to be provided for detecting whether an induced voltage Vi crosses offset voltages Vos1 and Vos2 during a high impedance period of an H-bridge circuit 101.

A data input terminal D of the flip-flop circuit 46 receives an output signal TP of a flip-flop circuit 41. A clock terminal CK of the flip-flop circuit 46 receives an output signal CMP1 of a comparator 1. An output terminal Q of the flip-flop circuit 46 outputs a crossing detecting signal X1.

A data input terminal D of the flip-flop circuit 47 receives the output signal TP of the flip-flop circuit 41. A clock terminal CK of the flip-flop circuit 47 receives an output signal CMP2 of a comparator 2. An output terminal Q of the flip-flop circuit 47 outputs a crossing detecting signal X2.

The crossing detecting operation of the flip-flop circuit 46 will be explained using wave form charts shown in FIGS. 9A and 9B.

The output signal TP of the flip-flop circuit 41 is a signal which is '1' during a high impedance period of the H-bridge circuit 101. The output signal CMP1 of the comparator 1 is a signal which changes from '0' to '1' when the induced voltage Vi crosses the offset voltage Vos1.

Figure 9A:
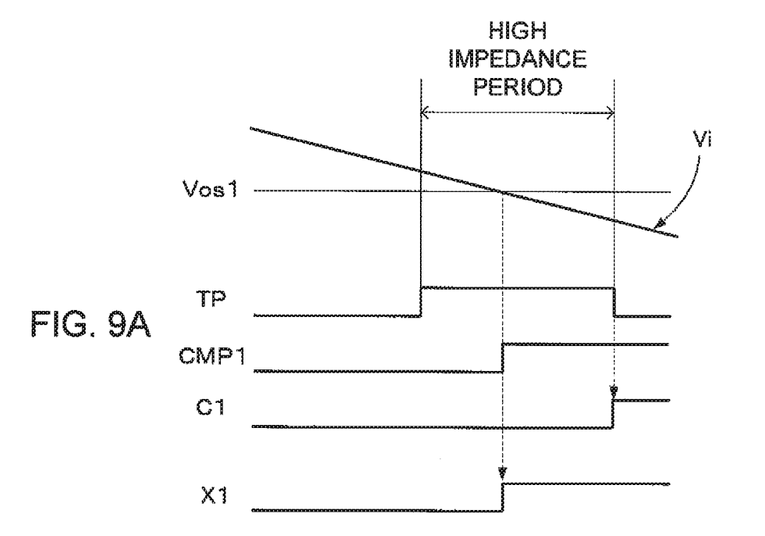
FIGS. 9A and 9B are wave form charts showing examples of an operation of flip-flops for judging crossing of an induced voltage in the second embodiment.

Accordingly, when an induced voltage Vi crosses the offset voltage Vos1 during a high impedance period of the H-bridge circuit 101 as shown in FIG. 9A, the output signal CMP1 of the comparator 1 rises from '0' to '1' during the high impedance period.

Thus, the flip-flop circuit 46 reads '1' of the output signal TP of the flip-flop circuit 41 in response to a rising of the output signal CMP1, and outputs '1' as the crossing detecting signal X1.

Subsequently, in response to a falling of the output signal TP, the output signal C1 of the flip-flop circuit 42 changes from '0' to '1'.

Figure 9B:
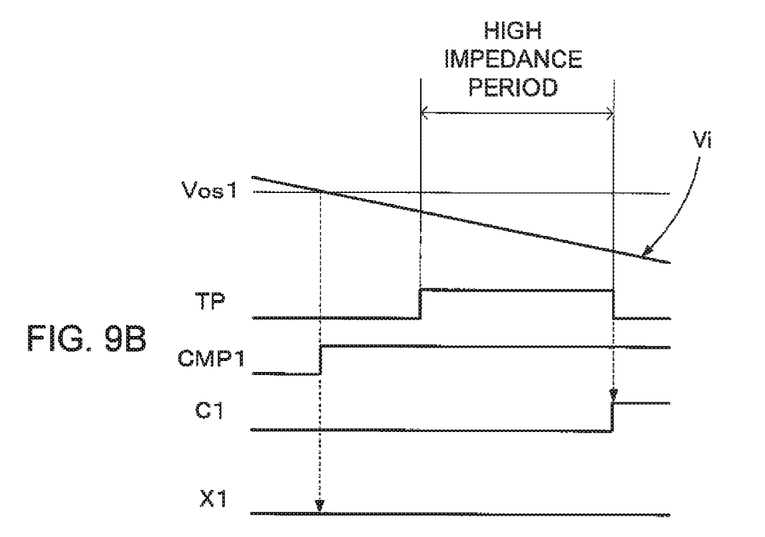

On the other hand, when an induced voltage Vi crosses the offset voltage Vos1 before a high impedance period of the H-bridge circuit 101 as shown in FIG. 9B, the output signal TP of the flip-flop circuit 41 at this time is '0' so that the flip-flop circuit 46 reads the '0' and outputs '0' as the crossing detecting signal X1.

In this case, the output signal C1 of the flip-flop circuit 42 also changes from '0' to '1' at the falling of the output signal TP.

In this way the crossing detecting signal X1 outputted from the flip-flop circuit 46 is a signal which indicates that the induced voltage Vi crosses the offset voltage Vos1 during the high impedance period of the H-bridge circuit 101. Similarly, the crossing detecting signal X2 outputted from the flip-flop circuit 47 is a signal which indicates that the induced voltage Vi crosses the offset voltage Vos2 during the high impedance period of the H-bridge circuit 101.

Both examples shown in FIGS. 9A and 9B are in a state that the phase of an induced voltage Vi is advanced more than the phase of a driving current of the motor, since the output signal C1 of the flip-flop circuit 42 is '1' at the time of falling of the output signal TP of the flip-flop circuit 41 which is an end of a high impedance period of the H-bridge circuit 101. However, when the degrees of advancement of the phases are compared, the advancement of the phase of the example of FIG. 9A is smaller than that of the example of FIG. 9B.

The example shown in FIG. 9A indicates a state that the torque of the motor M is controlled appropriately so that the phase of the induced voltage Vi approaches the phase of the driving current of the motor M, which is a state that the efficiency is high so that the operation is close to an ideal state. However, in such an ideal state, if a value of the DAC data is subtracted or reduced to decrease a driving current of the motor, a risk of step-out increases.

Thus, in the embodiment, the judging portion 44A performs judging a degree of advancement of the phase of the induced voltage Vi using the crossing detecting signals X1 and X2, and adds to the DAC data to perform processing to increase a margin of the driving current for step-out when there is possibility of occurrence of step-out.

Figure 10:
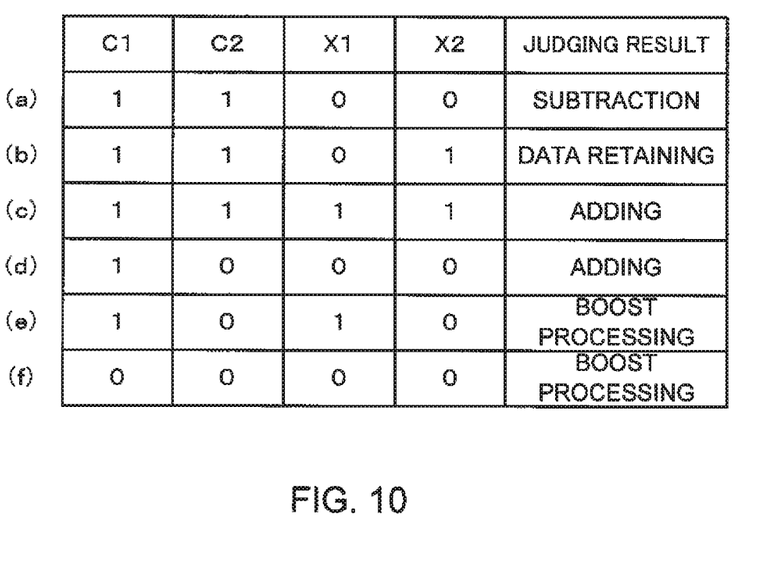
FIG. 10 is a table showing an example of judgment in a judging portion of the data determining portion according to the second embodiment.

FIG. 10 shows an example of judging results relating to control of a driving current of the motor obtained in the judging portion 44A. The judging results corresponds respectively to combinations of the output signals C1 and C2 of the flip-flop circuits 42 and 43 and the crossing detecting signals X1 and X2 from the flip-flop circuits 46 and 47. A judging operation of the judging portion 44A will be explained with reference to charts of FIGS. 11A to 11F which show difference of phases of an induced voltage Vi. In FIG. 10, six different combinations of output signals C1 and C2 and crossing detecting signals X1 and X2 are shown in a row (a) to a row (f), and six examples corresponding to these combinations are shown in FIGS. 11A to 11F, respectively.

(a) In a Case of C1=1, C2=1, X1=0, and X2=0

Figure 11A:
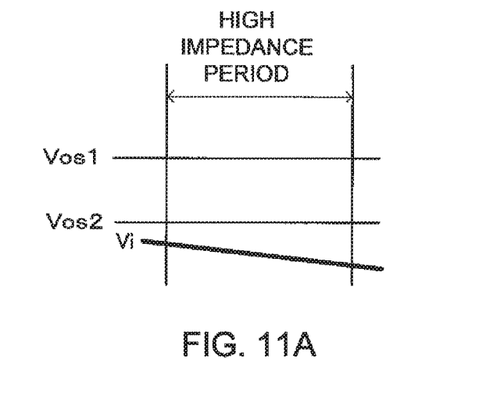
FIGS. 11A to 11F are charts for explaining an operation of the judging portion of the data determining portion according to the second embodiment.

The combination of these values occurs when a phase of an induced voltage Vi is advanced greatly as shown in FIG. 11A. The judging portion 44A determines to subtract from the DAC data which is provided to the DA converter 103 in order to decrease a driving current of the motor M.

(b) In a Case of C1=1, C2=1, X1=0, and X2=1

Figure 11B:
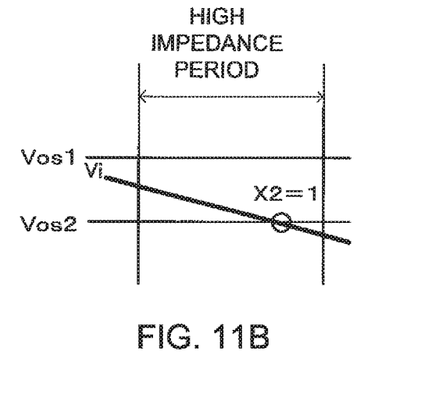

The combination of these values occurs when advancement of a phase of an induced voltage Vi becomes small as shown in FIG. 11B. The judging portion 44A determines to retain the DAC data.

(c) In a Case of C1=1, C2=1, X1=1, and X2=1

Figure 11C:
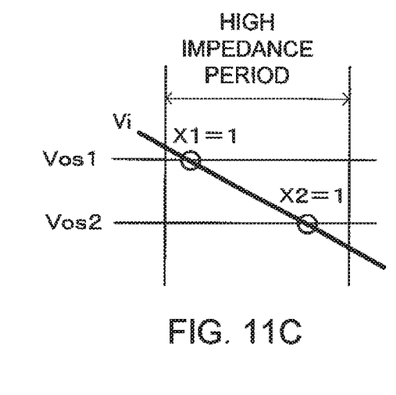

The combination of these values occurs when a phase of an induced voltage Vi suddenly begins to delay as shown in FIG. 11C. The judging portion 44A determines to add to the DAC data in order to increase a margin for step-out.

Figure 11D:
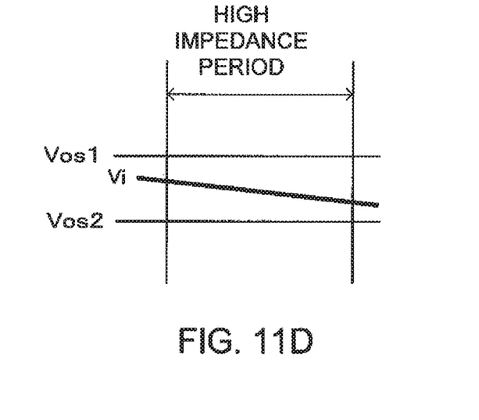

(d) In a case of C1=1, C2=0, X1=0, and X2=0 The combination of these values occurs when a phase of an induced voltage Vi begins to delay slowly as shown in FIG. 11D. The judging portion 44A determines to retain the DAC data.

(e) In a Case of C1=1, C2=0. X1=1, and X2=0

Figure 11E:
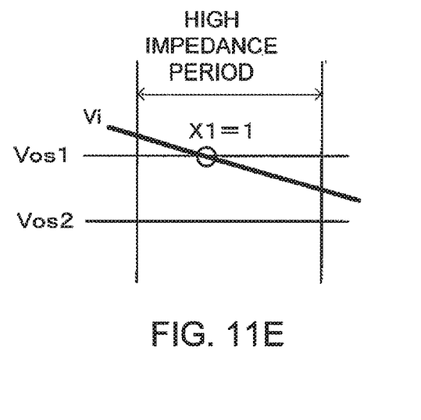

The combination of these values occurs when the delay of a phase of an induced voltage Vi begins to become larger as shown in FIG. 11E. The judging portion 44A determines to set the DAC data to be a value for boost processing for the motor driving current.

(f) In a Case of C1=0, C2=0, X1=0, and X2=0

Figure 11F:
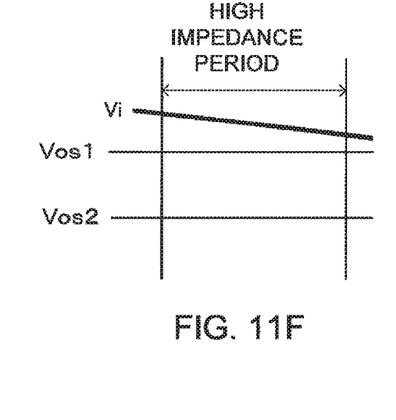

The combination of these values occurs when a phase of the induced voltage Vi is delayed as shown in FIG. 11F. The judging portion 44A determines to set the DAC data to a value corresponding to boost processing for a driving current of the motor.

According to the embodiment, since a larger number of the judging conditions are given for a phase of an induced voltage Vi by using the crossing detection signals X1 and X2, a driving current of the motor can be controlled more finely and step-out of the motor can be prevented effectively.

According to the devices for controlling motor driving in accordance with the above embodiments, the driving current of the motor can be set to an appropriate value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A device for controlling motor driving which can be used in a system to control a current flowing in an H-bridge circuit connected to a coil of a motor comprising:
 a first comparator which compares a voltage induced in the coil with a first threshold value;

a second comparator which compares the induced voltage with a second threshold value which is different from the first threshold value;

a zero level detecting portion which detects that the current flowing in the H-bridge circuit is zero; and a data determining portion which determines a value of digital data to be inputted to a DA converter that generates a reference voltage for use in controlling a driving current of the motor based on an output of the first comparator, an output of the second comparator and an output of the zero level detecting portion.

2. The device according to claim 1, wherein, in the case that an output of the first comparator and an output of the second comparator which are outputted during a period from when the zero level detecting portion detects that the current flowing in the coil is zero until when a clock signal rises are defined as a first output and as a second output respectively, the data determining portion reduces a value of digital data to be inputted to the DA converter when the first output indicates that the induced voltage exceeds the first threshold value and the second output indicates that the induced voltage exceeds the second threshold value, increases the value of digital data when the first output indicates that the induced voltage does not exceed the first threshold value and the second output indicates that the induced voltage does not exceed the second threshold value, and retains a present value of digital data when the first output indicates that the induced voltage exceeds the first threshold value and the second output indicates that the induced voltage does not exceed the second threshold value.

3. The device according to claim 2, wherein the zero level detecting portion detects that the current flowing in the H-bridge circuit is zero after the H-bridge circuit enters a current regeneration mode.

4. The device according to claim 2, wherein the H-bridge circuit is in a high impedance state from when the zero level detecting portion detects that the current is zero until when at least the clock signal rises.

5. The device according to claim 2, wherein the data determining portion comprises:

a first flip-flop circuit including a first data input terminal, a first clock terminal, a reset terminal, and a first output terminal, the first data input terminal being provided with a predetermined voltage, the first clock terminal receiving the output of the zero level detecting portion, and the reset terminal being provided with a clock signal;

a second flip-flop circuit including a second data input terminal, a second clock terminal, and a second output terminal, the second data input terminal receiving the output of the first comparator, the first clock terminal receiving an output of the first flip-flop circuit;

a third flip-flop circuit including a third data input terminal, a third clock terminal, and a third output terminal, the third data input terminal receiving the output of the second comparator, and the third clock terminal being provided with the output of the first flip-flop circuit;

a judging portion which receives outputs from the second and the third flip-flop circuits; and a register which receives an output from the judging portion and retains the value of digital data to be inputted to the DA convertor.

6. The device according to claim 5, wherein the data judging portion further comprises:

a forth flip-flop circuit including a forth data input terminal, a forth clock terminal, and a forth output terminal, the forth data input terminal receiving the output of the first comparator, and the forth clock terminal receiving the output of the first flip-flop circuit; and a fifth flip-flop circuit including a fifth data input terminal, a fifth clock terminal, and a fifth output terminal, the fifth data input terminal receiving the output of the second comparator, and the fifth clock terminal receiving the output of the first flip-flop circuit, wherein outputs of the fourth and the fifth flip-flop circuits are provided to the judging portion and the judging portion determines the value of digital data to be provided to the register according to the outputs of the second to the fifth flip-flop circuits.

7. The device according to claim 1, wherein the zero level detecting portion detects that the current flowing in the H-bridge circuit is zero after the H-bridge circuit enters a current regeneration mode.

8. The device according to claim 1, wherein the data determining portion retains a present value of digital data when the zero level detecting portion does not detect that the current is zero.

9. The device according to claim 1, wherein the data determining portion initializes the value of digital data when the zero level detecting portion does not detect that the current is zero.

10. The device according to claim 1, wherein the H-bridge circuit is in a high impedance state from when the zero level detecting portion detects that the current is zero until when at least a clock signal rises.

11. The device according to claim 1, wherein the data determining portion comprises:

a first flip-flop circuit including a first data input terminal, a first clock terminal, a reset terminal, and a first output terminal, the first data input terminal being provided with a predetermined voltage, the first clock terminal receiving the output of the zero level detecting portion, and the reset terminal being provided with a clock signal, a second flip-flop circuit including a second data input terminal, a second clock terminal, and a second output terminal, the second data input terminal receiving the output of the first comparator, the first clock terminal receiving an output of the first flip-flop circuit, a third flip-flop circuit including a third data input terminal, a third clock terminal, and a third output terminal, the third data input terminal receiving the output of the second comparator, and the third clock terminal being provided with the output of the first flip-flop circuit, a judging portion which receives outputs from the second and the third flip-flop circuits, and a register which receives an output from the judging portion and retains the value of digital data to be inputted to the DA convertor.

12. The device according to claim 11, wherein the data determining portion further comprises:

a forth flip-flop circuit including a forth data input terminal, a forth clock terminal, and a forth output terminal, the forth data input terminal receiving the output of the first comparator, and the forth clock terminal receiving the output of the first flip-flop circuit; and a fifth flip-flop circuit including a fifth data input terminal, a fifth clock terminal, and a fifth output terminal, the fifth data input terminal receiving the output of the second comparator, and the fifth clock terminal receiving the output of the first flip-flop circuit, wherein outputs of the fourth and the fifth flip-flop circuits are provided to the judging portion and the judging portion determines the value of digital data to be provided to the register according to the outputs of the second to the fifth flip-flop circuits.

* * * * *